(12) United States Patent
Lin et al.

(10) Patent No.: US 6,951,767 B1
(45) Date of Patent: Oct. 4, 2005

(54) DEVELOPMENT HASTENED STABILITY OF TITANIUM NITRIDE FOR APM ETCHING RATE MONITOR

(75) Inventors: Yen-Fei Lin, Dong-Gang jen (TW); Yueh-mao Sun, Taipei (TW); Wei-Jen Wen, Zhu-bei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 201 days.

(21) Appl. No.: 10/187,705

(22) Filed: Jul. 2, 2002

(51) Int. Cl.[7] .............................................. H01L 31/26
(52) U.S. Cl. ........................ 438/14; 438/720; 438/715; 438/719
(58) Field of Search .................... 438/14–18, 720–725, 438/737, 719, 715; 257/48, 640, 642, 644

(56) References Cited

U.S. PATENT DOCUMENTS

| 5,086,017 A | 2/1992 | Lu .............................. 437/200 |
| 5,516,399 A | 5/1996 | Balconi-Lamica et al. ........ 156/627.1 |
| 5,547,881 A | 8/1996 | Wang et al. .................... 437/24 |
| 5,870,121 A * | 2/1999 | Chan ............................ 347/59 |
| 5,872,062 A | 2/1999 | Hsu ............................ 438/720 |

OTHER PUBLICATIONS

Milosavljevic et al., "Influence of arsenic ion implantation on the formation of Ti silicides", IEEE, 1995, vol. 46, No. 8-10, pps. 1009-12.*

* cited by examiner

*Primary Examiner*—Carl Whitehead, Jr.
*Assistant Examiner*—Yennhu B. Huynh

(57) ABSTRACT

A method of fabricating a stabilized TiN control wafer comprising the following steps. A silicon substrate is provided having a silicon oxide layer formed thereover. An initial TiN layer is formed over the silicon oxide layer. The silicon substrate is placed in an atmosphere having ambient oxygen for from about 22 to 26 hours to form a rested TiN layer. The rested TiN layer is heated at a temperature of from about 115 to 125° C. for from about 85 to 95 seconds to form a heat treated TiN layer, whereby the heat treated TiN layer is stabilized to form the stabilized TiN control wafer.

22 Claims, 2 Drawing Sheets

DEVELOPMENT HASTENED STABILITY OF TITANIUM NITRIDE FOR APM ETCHING RATE MONITOR

FIELD OF THE INVENTION

The present invention relates generally to semiconductor fabrication and more specifically to the fabrication of control wafers used to monitor etching rates.

BACKGROUND OF THE INVENTION

Control wafers may be used to monitor integrated circuit (IC) processes such as, for example, etch rates.

U.S. Pat. No. 5,086,017 to Lu describes a laser interferometry etch rate monitor methods in a silicide process.

U.S. Pat. No. 5,872,062 to Hsu describes a method for etching titanium nitride.

U.S. Pat. No. 5,547,881 to Wang et al. describes an APM etch process for metal nitrides and other layers.

U.S. Pat. No. 5,516,399 to Balconi-Lamica et al. describes etch rate monitor processes.

SUMMARY OF THE INVENTION

Accordingly, it is an object of one or more embodiments of the present invention to provide an improved method of fabricating control wafers used to monitor an etching rate.

Other objects will appear hereinafter.

It has now been discovered that the above and other objects of the present invention may be accomplished in the following manner. Specifically, a silicon substrate is provided having a silicon oxide layer formed thereover. An initial TiN layer is formed over the silicon oxide layer. The silicon substrate is placed in an atmosphere having ambient oxygen for from about 22 to 26 hours to form a rested TiN layer. The rested TiN layer is heated at a temperature of from about 115 to 125° C. for from about 85 to 95 seconds to form a heat treated TiN layer, whereby the heat treated TiN layer is stabilized to form the stabilized TiN control wafer.

BRIEF DESCRIPTION OF THE DRAWINGS

The present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Process Known to the Inventors—not to be Considered Prior Art

The following process is known to the inventors and is not to be considered prior art against the instant invention.

Currently, control wafers having an overlying titanium nitride (TiN) layer are used to monitor the APM ($NH_4+H_2O_2+H_2O$) etching rate of metals such as, for example, cobalt (Co). The control wafers are prepared in two steps.

Figure 1:
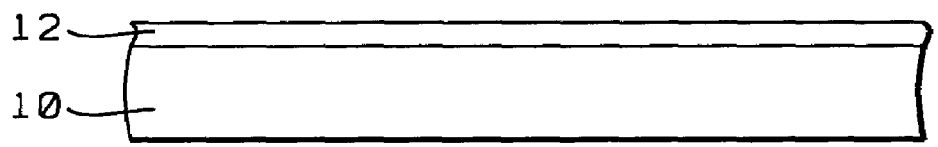
FIGS. 1 to 3 schematically illustrate a process known to the inventors.

In the first step and as shown in FIG. 1, a layer of silicon oxide ($SiO_2$) 12 is grown over a bare silicon (Si) wafer 10. The silicon oxide layer 12 has a thickness of preferably from about 1000 to 1100 Å and more preferably about 1050 Å.

Figure 2:
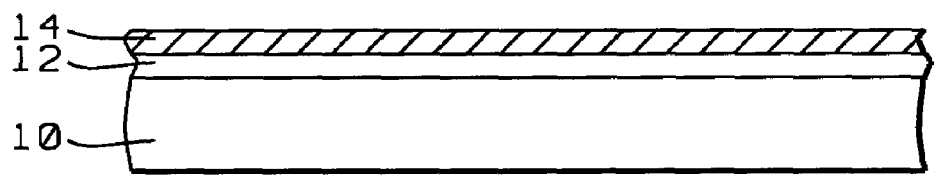

As shown in FIG. 2, a layer 14 of TiN is then deposited over the silicon oxide layer 12, preferably by a physical vapor deposition (PVD) process. The TiN layer 14 has a thickness of preferably from about 950 to 1050 Å and more preferably about 1000 Å.

The thickness of the TiN layer 14 is measured by Rs-100, that is using a four-point probe method measuring the resistance (Rs) then using the formula Rs=pL/A where p=density (of TiN); L=length of measurement; and A=area of measurement.

Figure 3:
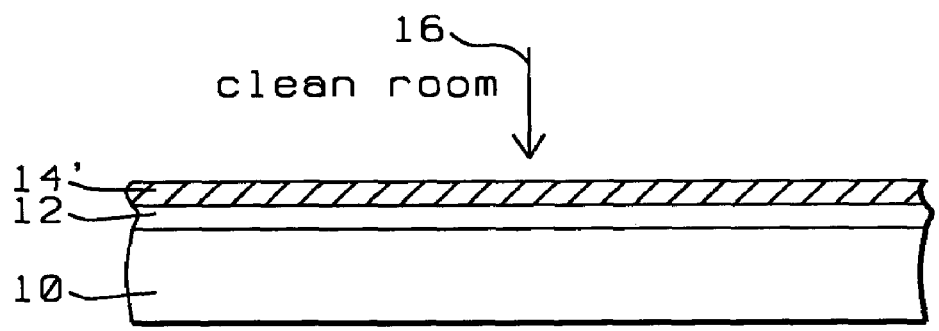

As shown in FIG. 3, after depositing the TiN layer 14, the control wafer must be placed in a clean room for at least seven days (as represented by arrow 16) to form stabilized TiN layer 14' having an improved etch rate for the APM treatment. This is because the resistance of the TiN layer 14 is unstable after about three (3) hours from its time of deposition based upon 300PL experimental data collected by the inventors where 300PL=300 mm wafer pilot line—an experiment fab for 12" wafer.

After at least seven days in a clean room, the TiN layer 14' overlying wafer 10 is subjected to an APM etch rate test to ensure its stability and ability to function as a control wafer. The instability of TiN will induce Rs measure shift.

Once the TiN layer 14' passes the APM etch rate test, the wafer 10 may then be used as a control wafer.

The inventors attempted to subject the wafer 10 having the overlying TiN layer 14 to various thermal treatments soon after deposition of the TiN layer 14 in attempts to eliminate the at least seven day clean room storage 16. When the thermal treatment was a rapid thermal anneal (RTA) at the temperatures 670° C., 680° C., 690° C., 700° C. and 710° C. for about 60 seconds, and preferably about 690° C. for about 60 seconds, soon after deposition of the TiN layer 14 for five respective wafers, the uniformity of the resulting etch rates for the RTA treated TiN layers 14 was out of specification. When the thermal treatment was a furnace anneal at about 410° C. for about 30 minutes soon after deposition of the TiN layer 14, the inventors found that the results were unrepeatable because the thermal budget (i.e. temperature by time) was too long and not well controlled so a furnace treatment was also unacceptable.

Instant Invention

As shown in FIGS. 4 to 7, the inventors have discovered that by first placing a wafer 30 with an upper silicon oxide layer 32 (FIG. 4) having a deposited TiN layer 34 formed over the silicon oxide layer 32 (FIG. 5) in a clean room for about one (1) day (as shown at 36 in FIG. 6) and then treating the wafer 30 with a hot plate treatment 40 (more preferably at about 120° C. for about 90 seconds) (FIG. 7) to form stabilized TiN layer 34' overlying wafer 30 as described in more detail below.

Initial Structure

Figure 4:
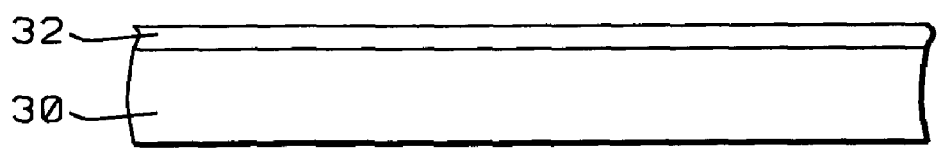
FIGS. 4 to 7 schematically illustrate a preferred embodiment of the present invention.

As shown in FIG. 4, silicon substrate/wafer 30 has overlying silicon oxide layer 32 grown thereover to a thickness of preferably from about 1000 to 1100 Å and more preferably about 1050 Å. The silicon oxide layer 32 serves as a barrier layer for measuring the thickness of the TiN layer 34 as it is formed and also makes it easier to recycle to reduce damage on the bare silicon surface of silicon substrate/wafer 30.

Formation of TiN Layer 34

Figure 5:
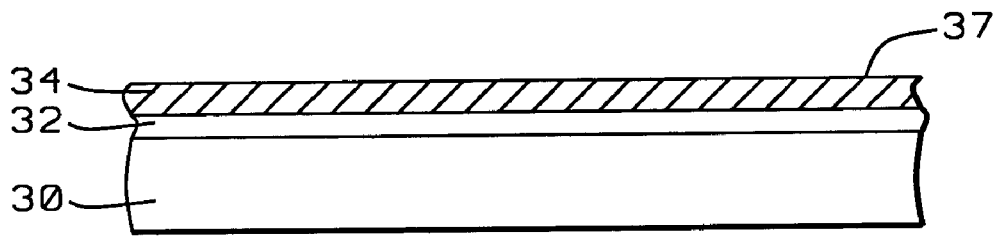

As shown in FIG. 5, a layer 34 of TiN is deposited over the silicon oxide layer 32, preferably by a physical vapor deposition (PVD) process. The TiN layer 34 has a thickness of preferably from about 950 to 1050 Å and more preferably about 1000 Å.

Placement of Wafer 30 in Clean Room 36 for About One Day

Figure 6:
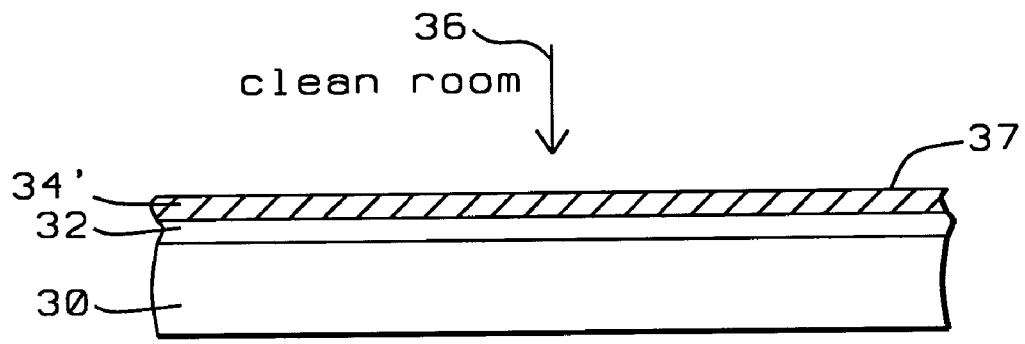
Figure 7:
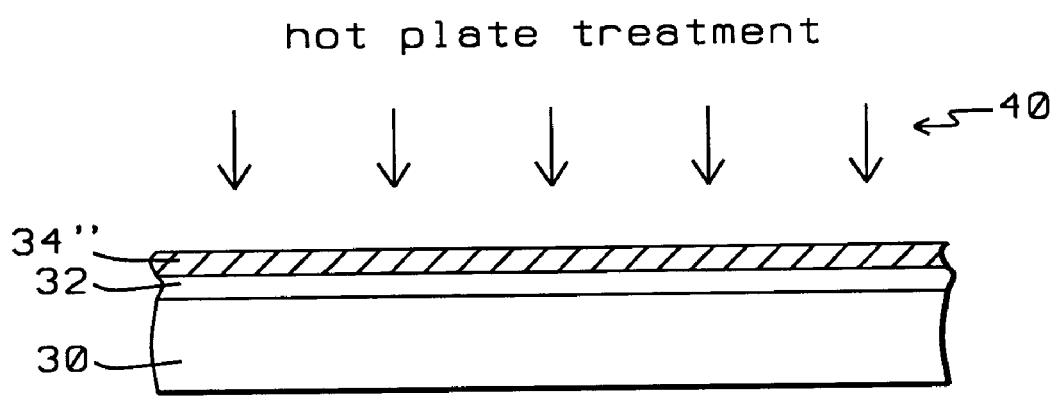

As shown in FIG. 6, wafer 30 with topmost TiN layer 34 is stored 36 in a clean room for preferably about 22 to 26 hours and more preferably about 24 hours to partially stabilize TiN layer 34 to form partially stabilized TiN layer 34' by, the inventors believe, the slow formation of a very thin $TiN_xO_{x-1}$ layer (not shown) over the upper surface 37 of TiN layer 34 by the reaction with ambient $O_2$ from the clean room (possibly from the humidity in the clean room) with the TiN of layer 34 by diffusion of oxygen into the TiN layer 34.

Hot Plate Treatment 40

Regardless of the mechanism that forms partially stabilized TiN layer 34', after wafer 30 has been stored in a clean room for more preferably about 24 hours, the wafer is removed and is subjected to a hot plate treatment 40 that speeds up formation of a thicker $TiN_xO_{x-1}$, layer 38' and to form fully stabilized TiN layer 34". Thicker $TiN_xO_{x-1}$ layer 38' will be removed during a subsequent APM etch ($NH_4+H_2O_2+H_2O$).

The hot plate treatment 40 is conducted at a temperature of preferably from about 115 to 125° C. for from about 85 to 95 seconds and more preferably about 120° C. for about 90 seconds. The use of hot plate treatment 40 permits a short thermal cycle and a low temperature to further minimize risks of TiN peeling.

The inventors have determined that the subsequent APM etch rate of the fully stabilized TiN layer 34" formed in accordance with the method of the instant invention is within the target specification of 300±40 Å/minute with a uniformity of less than about 20% that compares with a seven day clean room storage method without any thermal treatment. Thus a seven day process is reduced to only about 1 day using the method of the instant invention.

While particular embodiments of the present invention have been illustrated and described, it is not intended to limit the invention, except as defined by the following claims.

We claim:

1. A method of fabricating a stabilized TiN control wafer, the steps comprising:
   providing a silicon substrate having a silicon oxide layer formed thereover;
   forming an initial TiN layer over the silicon oxide layer;
   placing the silicon substrate in an atmosphere having ambient oxygen for from about 22 to 26 hours to form a rested TiN layer; and
   heating the rested TiN layer to form a heat treated TiN layer, whereby the heat treated TiN layer is stabilized to form the stabilized TiN control wafer, and the TiN layer is heated using a hot plate treatment.

2. The method of claim 1, wherein the silicon oxide layer is from about 1000 to 1110 Å thick and the initial TiN layer is from about 950 to 1050 Å.

3. The method of claim 1, wherein the silicon oxide layer is about 1050 Å thick and the initial TiN layer is about 1000 Å.

4. The method of claim 1, wherein the silicon substrate is placed in the atmosphere having ambient oxygen for about 24 hours to form the rested TiN layer.

5. The method of claim 1, wherein the rested TiN layer is heated at a temperature of from about 115 to 125° C. for from about 85 to 95 seconds.

6. The method of claim 1, wherein the rested TiN layer is heated at a temperature of from about 120° C. for about 90 seconds.

7. The method of claim 1, wherein the initial TiN layer is formed by a physical vapor deposition method.

8. The method of claim 1, wherein the silicon substrate is placed in a clean room having an ambient oxygen atmosphere.

9. The method of claim 1, wherein the rested TiN layer includes an overlying $TiN_xO_{x-1}$ layer.

10. The method of claim 1, wherein the rested TiN layer and the stabilized TiN control wafer include an overlying $TiN_xO_{x-1}$ layer.

11. The method of claim 1, wherein the rested TiN layer includes an overlying $TiN_xO_{x-1}$ layer that partially stabilizes the rested TiN layer.

12. A method of fabricating a stabilized TiN control wafer, the steps comprising:
   providing a silicon substrate having a silicon oxide layer formed thereover;
   forming an initial TiN layer over the silicon oxide layer;
   placing the silicon substrate in an atmosphere having ambient oxygen for from about 22 to 26 hours to form a rested TiN layer; and
   heating the rested TiN layer to form a heat treated TiN layer, whereby the heat treated TiN layer is stabilized to form the stabilized TiN control wafer, and the control wafer is used to measure Rs or etch rate.

13. The method of claim 12, wherein the silicon oxide layer is from about 1000 to 1100 Å thick and the initial TiN layer is from about 950 to 1050 Å.

14. The method of claim 12, wherein the silicon oxide layer is about 1050 Å thick and the initial TiN layer is about 1000 Å.

15. The method of claim 12, wherein the silicon substrate is placed in the atmosphere having ambient oxygen for about 24 hours to form the rested TiN layer.

16. The method of claim 12, wherein the rested TiN layer is heated at a temperature of from about 115 to 125° C. for from about 85 to 95 seconds.

17. The method of claim 12, wherein the rested TiN layer is heated at a temperature of from about 120° C. for about 90 seconds.

18. The method of claim 12, wherein the initial TiN layer is formed by a physical vapor deposition method.

19. The method of claim 12, wherein the silicon substrate is placed in a clean room having an ambient oxygen atmosphere.

20. The method of claim 12, wherein the rested TiN layer includes an overlying $TiN_xO_{x-1}$ layer.

21. The method of claim 12, wherein the rested TiN layer and the stabilized TiN control wafer include an overlying $TiN_xO_{x-1}$ layer.

22. The method of claim 12, wherein the rested TiN layer includes an overlying $TiN_xO_{x-1}$ layer that partially stabilizes the rested TiN layer.

* * * * *